United States Patent
Kawakita

[19]

[11] Patent Number: 6,052,283
[45] Date of Patent: Apr. 18, 2000

[54] STORAGE UNITS

[75] Inventor: Shinji Kawakita, Yokkaichi, Japan

[73] Assignee: Sumitomo Wiring Systems, Ltd., Japan

[21] Appl. No.: 09/022,138

[22] Filed: Feb. 11, 1998

[30] Foreign Application Priority Data

Feb. 13, 1997 [JP] Japan .................................... 9-029430

[51] Int. Cl.[7] .................................................. H05K 7/20
[52] U.S. Cl. .......................................................... 361/695
[58] Field of Search .................................... 361/600, 679, 361/688, 690, 694–695, 729, 730, 735, 744

[56] References Cited

U.S. PATENT DOCUMENTS

| | | | |
|---|---|---|---|
| 4,500,944 | 2/1985 | Roberts et al. | 361/690 |
| 4,694,119 | 9/1987 | Groenewegen . | |
| 4,763,224 | 8/1988 | Bentz et al. . | |
| 4,944,401 | 7/1990 | Groenewegen . | |
| 5,202,815 | 4/1993 | Le Buennec et al. | 361/695 |
| 5,773,755 | 6/1998 | Iwatare | 361/695 |

FOREIGN PATENT DOCUMENTS

| | | |
|---|---|---|
| 0778180 | 11/1997 | European Pat. Off. . |
| 9163556 | 6/1997 | Japan . |

OTHER PUBLICATIONS

European Search Report EP 98 10 2535.
EPO—Patent Abstracts of Japan, Publication #08275335, Publication date: Oct. 18, 1996.

*Primary Examiner*—Gregory Thompson
*Attorney, Agent, or Firm*—Jordan B. Bierman; Bierman, Musserlian and Lucas

[57] ABSTRACT

A storage box including an inner box housing an electronic control unit, an outer box housing the inner box, and an open space between the two boxes which allows for cooling air to circulate. A cover is formed integrally with the inner box via a thin hinge. The electronic control unit is thereby protected from heat generated by an automobile engine, as well as dirt and moisture.

10 Claims, 3 Drawing Sheets

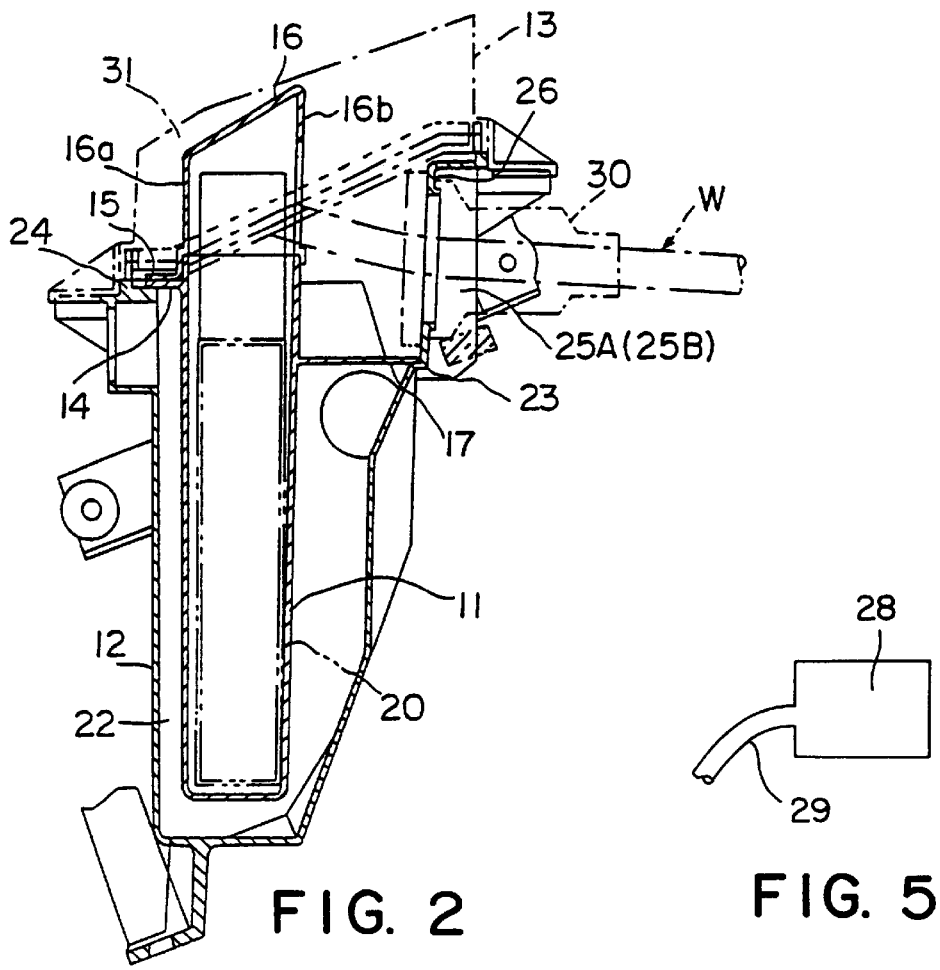
FIG. 2
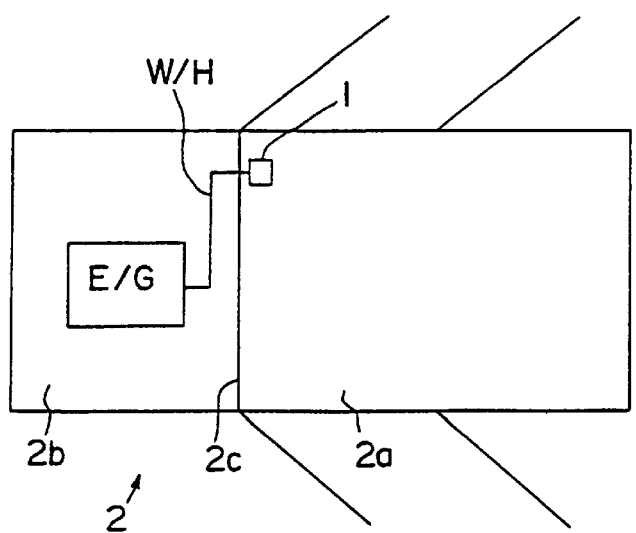
FIG. 5
FIG. 3
PRIOR ART

STORAGE UNITS

This Application claims the benefit of the priority of Japanese Application 9-29430, filed Feb. 13, 1997.

The present Invention relates to storage boxes for automotive electronic control units; and, more specifically, to storage boxes mounted in the engine compartment of an automobile which protect the electronic control units from damage due to water and dirt from the road and from excessive heat from the engine.

BACKGROUND OF THE INVENTION

Automobiles are equipped with electronic control units for controlling the various electrical components therein, e.g. electronic fuel injection and anti-lock brake systems. Water and dirt entering the engine compartment from the road, as well as high temperatures, decrease the reliability of electronic control units. Heat, water, and dirt are known to have deleterious effects on the semiconductors which are used in these devices. In order to have adequate heat and water resistance, specially designed semiconductors must be used, which makes the unit very expensive.

One solution has been to mount the electronic control unit in the passenger compartment of the automobile. As shown in FIG. 3, electronic control unit 1 is mounted in car 2 in passenger compartment 2a. The problem with mounting electronic control unit 1 in passenger compartment 2a is that wire harness W/H must be passed from engine compartment 2b into passenger compartment 2a. This requires a long wire harness W/H to pass through panel 2c, which separates passenger compartment 2a from engine compartment 2b. This generates complex operations and increased costs.

Another solution to the problem is to use a protective storage box. As shown in FIG. 4, and discussed in Japanese Patent Application Number 8-275335, electronic control unit 1 is housed in a storage box comprising inner box 3, outer box 4, and upper cover 5. A space is formed between inner box 3 and outer box 4 to allow cooling air to circulate and heat to dissipate. Although the storage box shown in FIG. 4 has good heat radiation characteristics, it has problems with water-tightness. Openings 3a of inner box 3 are covered only by upper cover 5. Thus, if upper cover 5 is damaged, or if water droplets form on its inner wall due to condensation or the like, electronic control unit 1 comes into contact with water, leading to malfunction or damage.

SUMMARY OF THE INVENTION

The object of the present Invention is to overcome the problems described above and to prevent water from coming into contact with the electronic control unit in the inner box while providing good air circulation and heat dissipation.

Broadly, the present Invention relates to a storage box for electronic control units comprising: an inner box for housing an electronic control unit and an outer box for housing the inner box, wherein there is an open space between the inner and outer boxes. The inner box has a cover connected to the inner box via a hinge. The cover of the inner box seals the inner box after the electronic control unit has been inserted. The outer box has a cover which is attached to the outer box so that it surrounds the cover of the inner box and seals the inner box inside said outer box. In this way, the electronic control unit is doubly protected from external water while providing good heat dissipation.

Also, because the inner box has a cover, condensation on the inside of the cover of the outer box will not have an effect on the electronic control unit because the inner box cover will prevent the ingress of water. Thus, water is prevented from coming into contact with the electronic control unit.

An edge of one of the walls of the cover for the inner box is connected to the inner box via a hinge, and the opposite side wall of the cover of the inner box is cut away to form a wire exit/entrance opening. Also, an opening for wire is correspondingly located on the outer box.

A mounting plate projects horizontally from the outer surface of the upper portion of the inner box. The mounting plate is mounted on a seat disposed on the inside of the upper box. The inner box is held and supported in the outer box by means of the mounting plate and seat.

An intake opening and an exhaust opening are disposed on the outer box and both communicate with the open space between the inner and outer boxes. The intake opening is connected to a duct disposed at the front of the engine compartment to introduce pressure from an electric fan of the car. This allows cooling air to flow into the open space between the outer box and the inner box for dissipation of heat. Thus, the electronic control unit can be placed in the engine compartment, which has a high-temperature atmosphere, without resulting in heat-related problems. Also, the electronic control unit is protected from the ingress of water by using the double box configuration of the present Invention.

The storage box for electronic control units of the present Invention comprise an inner box and an outer box which form a two-layered structure. The inner box, which houses the electronic control unit, is formed integrally with the cover. Once the electronic control unit is stored, the space can be sealed by simply closing the cover. Thus, if a crack or break occurs on the cover of the outer box or the outer box itself, or if water droplets form on the inner surface of the cover of the outer box, water is prevented from coming into contact with the electronic control unit, thus avoiding malfunction or damage. Furthermore, since the inner box is almost completely watertight, only light waterproofing is needed for the wire inserted in the outer box, thereby allowing these elements to have a simple structure.

Moreover, since the space between the inner box and the outer box is open, cooling air circulates in the space and prevents the electronic control unit from overheating. Thus, the electronic control unit can be disposed in the high-temperature atmosphere of an engine compartment without experiencing problems related to overheating.

In the accompanying drawings, constituting a part hereof, and in which like reference characters indicate like parts,

BRIEF DESCRIPTION OF THE DRAWINGS

FIG. 2 illustrates a cross-sectional view of the present Invention;

FIG. 3 illustrates a prior art placement of an electrical control unit;

FIG. 5 is a schematic view of the fan and conduit.

Referring to FIG. 1 and FIG. 2, storage box 10 comprises: an inner box 11 for housing electronic control unit 20; an outer box 12, which houses inner box 11. Outer box 12 is shown in two pieces, lower half 12' and cover 13.

Figure 1:
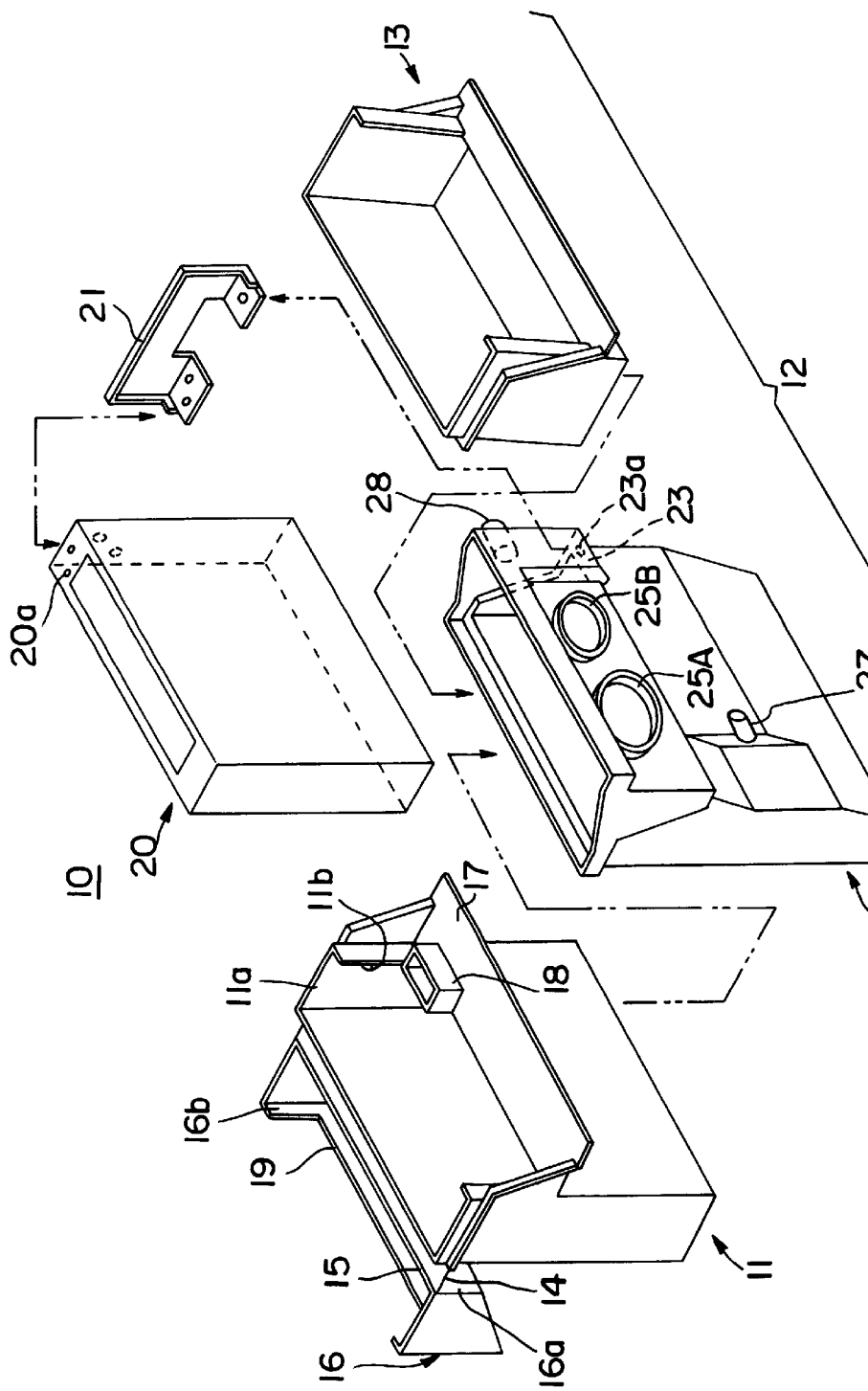
FIG. 1 illustrates an exploded view of the present Invention.
Figure 4:
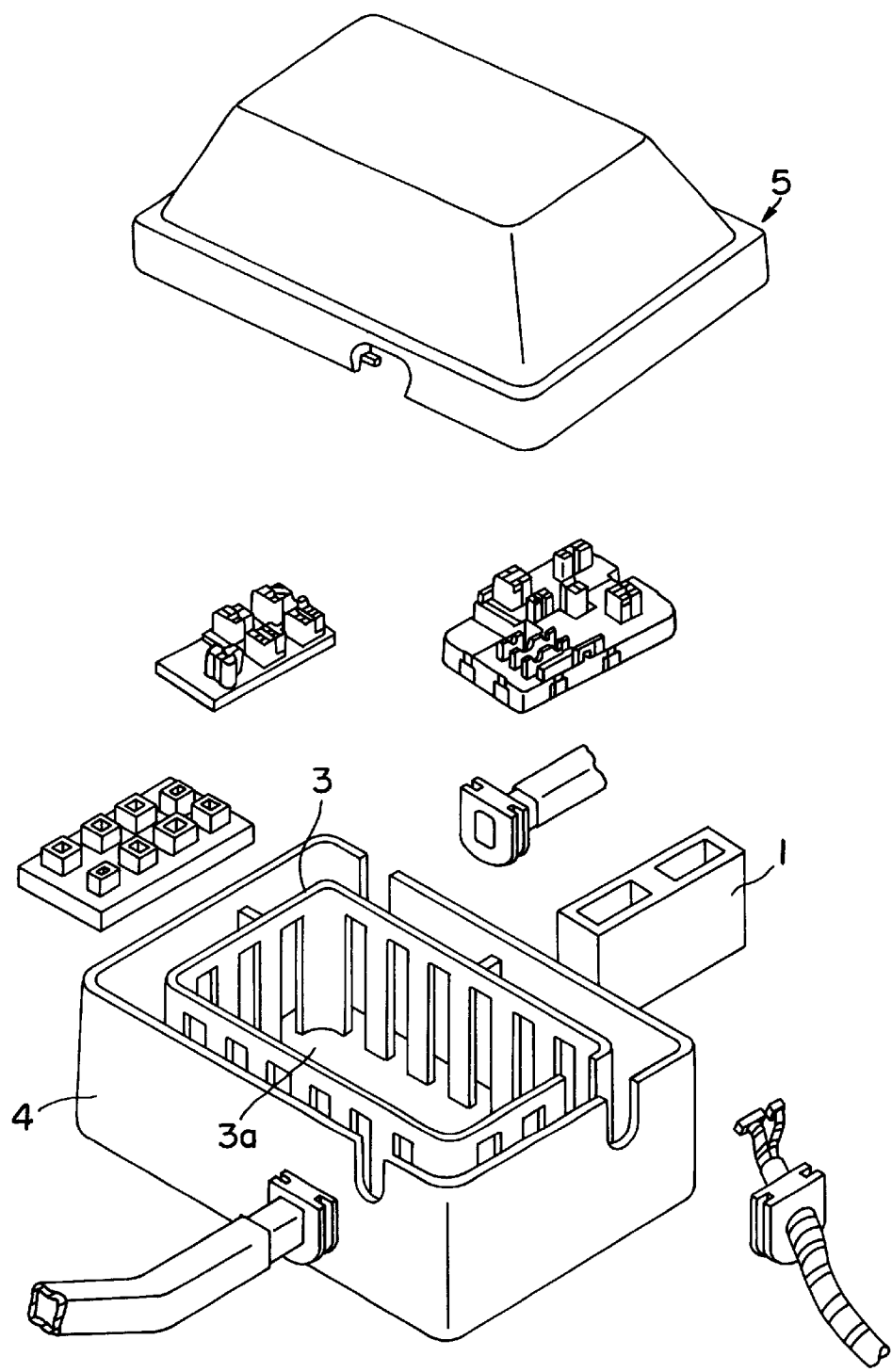
FIG. 4 illustrates a prior art storage box.

Inner box 11 comprises opening 11a at its upper surface through which electronic control unit 20 is inserted. Mounting plate 14 projects horizontally outward from the upper portion of one side of inner box 11 which surrounds upper surface opening 11a. The end of mounting plate 14 is formed integrally with cover 16 via thin hinge 15. Cover 16 pivots around thin hinge 15 to close and seal opening 11a.

Side-surface opening 11b is formed as a cut-out from the upper end of the side wall of inner box 11, opposite the side on which cover 16 is hinged. Side-surface opening 11b is formed to be continuous with upper-surface opening 11a. Mounting plate 17 projects horizontally outwardly from inner box 11 at the lower end of side-surface opening 11b. Connector holder 18 is formed on mounting plate 17.

Wire exit opening 19 is formed by cutting away a portion of side wall surface 16b which faces side wall surface 16a. When cover 16 is pivoted and closed, wire exit opening 19 is aligned with side-surface opening 11b so that wire group W from electronic control unit 20 housed in inner box 11 can exit therethrough.

When electronic control unit 20 is inserted in inner box 11, the upper end of electronic control unit 20 is positioned at upper-surface opening 11a. Attachment opening 20a is located on electronic control unit 20; one end of bracket 21 is attached thereto, and the other end of bracket 21 is attached to attachment hole 23a, which is on seat 23 of outer box 12.

Outer box 12 is shaped so that it can hold the entire outer perimeter of inner box 11, including its bottom surface, while leaving open space 22 between inner box 11 and outer box 12. On one side of outer box 12, at the upper end, there is disposed seat 24 for mounting mounting plate 14 of inner box 11. On the other side, there is disposed seat 23 for mounting mounting plate 17. By mounting mounting plates 14 and 17 of inner box 11 on seats 24 and 23, inner box 11 is supported in outer box 12 while maintaining open space 22.

Vertical plate 26 projects from the end of seat 23. Wire openings 25A and 25B are formed on vertical plate 26. The wire from wire exit opening 19 of inner box 11 exits through wire openings 25A and 25B and a watertight seal is formed by grommet 30.

Furthermore, intake opening 27 and exhaust opening 28 are disposed on side walls of outer box 12. Intake opening 27 is connected to conduit 29 of electric fan 28 (see FIG. 5), of an electric fan (not shown in the drawing), and cooling air is forced into open space 22 between outer box 12 and inner box 11 and is circulated between inner box 11 and outer box 12.

Upper cover 13 is shaped so that it can be locked to the upper end of lower portion 12' of outer box 12. Upper cover 13 is attached to the upper end of lower portion 12' of outer box 12 when electronic control unit 20 is housed in inner box 11 and cover 16 is sealed over electronic control unit 20. The attachment of upper cover 13 creates open space 31 between upper cover 13 and cover 16, thereby allowing for the dissipation of heat.

In order to assemble the storage box of the present Invention, cover 16 is opened and electronic control unit 20 is inserted through upper-surface opening 11a of inner box 11. Then, bracket 21 is attached to electronic control unit 20 and cover 16 is closed. In this state, upper-surface opening 11a and side-surface opening 11b are sealed by cover 16. The wire group is drawn out through wire exit opening 19. Then, inner box 11 is inserted in outer box 12, and mounting plates 14 and 17 are mounted on seats 24 and 23, respectively. The wires from electronic control unit 20, which were drawn out of wire exit opening 19 of inner box 11, are drawn through wire openings 25A and 25B of outer box 12 and sealed via grommet 30. Bracket 21 is attached to outer box 21 and upper cover 13 is placed over lower portion 12' of outer box 12 and locked. Storage box 10 is mounted in the engine compartment of the car via a bracket 30 projecting from outer box 12.

With the configuration described above, upper-surface opening 11a and side-surface opening 11b of inner box 11 are sealed by cover 16, with only wire exit opening 19 being open. However, wire exit opening 19 is on a side surface and is blocked by the wire group. Thus, inner box 11 is almost completely sealed.

Thus, even if upper cover 13 breaks or cracks, electronic control unit 20 is protected from water by inner box 11. Also, cover 16 of inner box 11 is molded integrally with inner box 11; this allows inner box 11 to be easily sealed. Furthermore, the circulation of cooling air in open space 22 between inner box 11 and outer box 12 prevents the high-temperature atmosphere in the engine room from overheating electronic control unit 20.

While only a limited number of specific embodiments of the present invention have been expressly disclosed, it is, nonetheless, to be broadly construed, and not to be limited except by the character of the claims appended hereto.

I claim:

1. A storage box for an electronic control unit comprising an inner box and an outer box, said inner box having a unit opening and adapted to receive said electronic control unit through said unit opening, an inner cover complementary to said unit opening and adapted to fit thereover, thereby to enclose said electronic control unit, said outer box enclosing said inner box, a space between said inner box and said outer box;

an intake opening in said outer box and an exhaust opening in said outer box, each of said intake opening and said exhaust opening communicating between said space and an exterior of said outer box.

2. The storage box of claim 1 wherein there is at least one wire extending out of said electronic control unit, passing through a wire exit port, and exiting said storage box through a wire opening in said outer box, a grommet on said wire and bearing against said wire and a periphery of said wire opening.

3. The storage box of claim 1 wherein said wire substantially fills said wire exit port.

4. The storage box of claim 1 wherein said intake opening is connected to a source of air, whereby said air passes through said intake opening, into said space, and out said exhaust opening.

5. The storage box of claim 1 wherein said intake opening and said exhaust opening are spaced apart from each other.

6. The storage box of claim 5 wherein said source of air is a fan and there is a conduit from said fan to said intake opening.

7. The storage box of claim 1 wherein said inner cover is hinged to a sidewall of said inner box.

8. The storage box of claim 1 wherein said outer box has an upper cover adapted to close and seal said outer box when said inner box is in said outer box.

9. The storage box of claim 1 comprising a mounting plate normal to a side wall of said inner box adjacent an upper end of said side wall, a seat on said outer box, complementary to said mounting plate, said mounting plate resting on said seat.

10. The storage box of claim 2 comprising a mounting plate normal to a side wall of said inner box adjacent an upper end of said side wall, a seat on said outer box, complementary to said mounting plate, said mounting plate resting on said seat.

* * * * *